(12) United States Patent
Sakamoto

(10) Patent No.: US 6,806,181 B2
(45) Date of Patent: Oct. 19, 2004

(54) METHOD OF FABRICATING AN AIR BRIDGE

(75) Inventor: Kazuyuki Sakamoto, Yamanashi (JP)

(73) Assignee: Fujitsu Quantum Devices Limited, Yamanashi (JP)

(*) Notice: Subject to any disclaimer, the term of this patent is extended or adjusted under 35 U.S.C. 154(b) by 0 days.

(21) Appl. No.: 10/100,061

(22) Filed: Mar. 19, 2002

(65) Prior Publication Data

US 2002/0140007 A1 Oct. 3, 2002

(30) Foreign Application Priority Data

Mar. 30, 2001 (JP) ......................................... 2001-101442

(51) Int. Cl.[7] ....................... H01L 21/4763; H01L 21/44
(52) U.S. Cl. ........................ 438/619; 438/643; 438/687
(58) Field of Search ................................ 438/319, 411, 438/421, 422, 619; 257/410, 522

(56) References Cited

U.S. PATENT DOCUMENTS

| | | | |
|---|---|---|---|
| 3,539,705 A | * | 11/1970 | Nathanson et al. |
| 4,972,250 A | * | 11/1990 | Omori et al. |
| 4,987,101 A | * | 1/1991 | Kaanta et al. ............... 438/619 |
| 5,324,683 A | * | 6/1994 | Fitch et al. ................ 438/422 |
| 5,798,559 A | * | 8/1998 | Bothra et al. |

FOREIGN PATENT DOCUMENTS

| | | |
|---|---|---|
| JP | 61043448 A | 3/1986 |
| JP | 61095554 A | 5/1986 |
| JP | 63088844 A | 4/1988 |
| JP | 02307247 A | 12/1990 |
| JP | 03283627 A | 12/1991 |
| JP | 04279031 A | 10/1992 |
| JP | 10012722 A | 1/1998 |

OTHER PUBLICATIONS

Japanese Office Action in the corresponding Japanese application, dated Apr. 22, 2003.

* cited by examiner

Primary Examiner—Ha Tran Nguyen
(74) Attorney, Agent, or Firm—Westerman, Hattori, Daniels & Adrian, LLP

(57) ABSTRACT

A protective pattern is formed on a semiconductor substrate in a shape covering a circuit region and exposing an air bridge connecting portion, a metallic film and an insulating film are formed to cover the protective pattern, the metallic film and the insulating film are patterned to form air bridge wiring and an air bridge protective film covering the air bridge wiring, and thereafter, the protective pattern is removed to form a hollow between the air bridge wiring and the circuit region.

10 Claims, 5 Drawing Sheets

METHOD OF FABRICATING AN AIR BRIDGE

CROSS-REFERENCE TO RELATED APPLICATIONS

This application is based upon and claims priority of Japanese Patent Application No. 2001-101442, filed on Mar. 30, 2001, the contents being incorporated herein by reference.

BACKGROUND OF THE INVENTION

1. Field of the Invention

The present invention relates to a semiconductor device and a method for fabricating the same and, particularly, it is preferable to be applied to a high-frequency compound semiconductor device using a GaAs substrate or the like.

2. Description of the Related Art

Conventionally, when wires of MESFETs or the like formed on a semiconductor substrate are connected, as a method for connecting wires formed substantially on the same surface, particularly, a method of forming air bridge wiring is proposed.

An example of a semiconductor device having the air bridge structure is shown in FIG. 5.

Here, a circuit region in which a plurality of MESFETs (having a source 102, a drain 103, and an overhanging-shaped gate electrode 104) are provided substantially on the same surface of a semiconductor substrate 101 is formed, the sources 102 of adjacent MESFETs are connected with each other by air bridge wiring 105, and a hollow 107 is formed between the air bridge wiring 105 and constituents of the MESFET under the air bridge wiring 105.

The provision of such an air bridge structure reduces parasitic capacitance between the wires (the sources 102, in this case) so that characteristics of low noise and high gains can be obtained in a high-frequency region. Accordingly, the air bridge structure is preferable to be applied to a compound semiconductor device requiring a high-frequency characteristic.

In the semiconductor device having the air bridge structure shown in FIG. 5, the air bridge wiring 105 is exposed in order to give a high priority to the high-frequency characteristic.

However, in measuring various characteristics of fabricated semiconductor chips, when scratch is performed, for example, a metallic dust or the like easily occurs and it is assumed that the dust adheres to the air bridge wiring after a wafer process so as to cause troubles such as a poor connection or a break.

In order to suppress the occurrence of the above troubles and to improve reliability of the device, as shown in FIG. 6, it is required to form a thick air bridge protective film 106 over the entire surface including the air bridge wiring 105 after forming a series of various wires and the like by patterning as shown in FIG. 5.

In this case, however, there is a problem that a part between the wires is buried in the air bridge protective film in an area where a wiring pattern of the circuit region is dense although the part between the wires, in an area where the wiring pattern of the circuit region is sparse, is not buried even if the thick air bridge protective film is formed.

Especially, as shown in FIG. 5 and FIG. 6, in a case in which a structure in a relatively complicated shape, for example, an overhanging shape such as of a gate electrode 104, is formed in the circuit region, a film thickness of the air bridge protective film becomes insufficient in a part covering the structure, which results in forming the air bridge protective film in an ununiform film thickness as a whole.

In other words, since growth of a film thickness of the air bridge protective film varies according to a pattern of the structure in the circuit region, control of the film thickness becomes difficult, which sometimes makes it impossible to ensure accuracy of the air bridge protective film and to fabricate a device of high accuracy, causing a problem that obtaining an intended high-frequency characteristic is extremely difficult.

As described above, presently, although an air bridge structure is adopted to realize a high-frequency device, formation of a protective film to prevent troubles such as a poor connection and a break of air bridge wiring results in impairing a high-frequency characteristic.

SUMMARY OF THE INVENTION

The present invention is made in consideration of the above problem, and it is an object of the present invention to provide a semiconductor device and a method for fabricating the same, in which an air bridge structure is adopted while troubles such as a poor connection or a break of air bridge wiring can be surely prevented so as to realize a high-frequency characteristic as well as to sufficiently ensure high reliability of the device.

As a result of intensive studies, the inventor has thought of forms of the invention explained below.

A target semiconductor device of the present invention is a semiconductor device constituted in a manner in which a circuit region having a plurality of wires is formed on a semiconductor substrate, in which an air bridge electrically connecting predetermined wires among the wires in the circuit region is provided, an air bridge protective film covering the air bridge is formed, and at least a lower portion of the air bridge in the circuit region is a region over which the air bridge protective film is not formed.

Another constitution of the semiconductor device of the present invention comprises: a semiconductor substrate, a circuit region provided on the semiconductor substrate and having a plurality of wires; an air bridge electrically connecting predetermined wires among the wires in the circuit region; and an air bridge protective film covering only the air bridge.

A method for fabricating a semiconductor device according to the present invention comprises the steps of: forming a protective pattern in a shape covering a predetermined area on a semiconductor substrate and exposing an air bridge connecting portion at an end thereof; forming a conductive film covering the protective pattern; processing the conductive film to form air bridge wiring connected with the air bridge connecting portion following the shape of the protective pattern; forming an insulating film covering the conductive film; processing the insulating film to form an air bridge protective film having a predetermined shape covering the air bridge wiring; and removing the protective pattern to form a hollow between the air bridge wiring and the predetermined area.

Another constitution of the method for fabricating a semiconductor device according to the present invention comprises the steps of: forming a protective pattern in a shape covering a predetermined area on a semiconductor substrate and exposing an air bridge connecting portion at an end thereof; forming a conductive film covering the protective pattern; forming an insulating film covering the conductive film; processing the insulating film and the conductive film to form air bridge wiring connected with the air bridge connecting portion following the shape of the protective pattern and to form an air bridge protective film covering the air bridge wiring; and removing the protective pattern to form a hollow between the air bridge wiring and the predetermined area.

DETAILED DESCRIPTION OF THE PREFERRED EMBODIMENTS

Preferred embodiments to which the present invention is applied will be explained below with reference to the drawings.

First Embodiment

In this embodiment, an MESFET having a high-frequency characteristic, which is a compound semiconductor device using, for example, a GaAs substrate or the like, is described as an example. Hereinafter the constitution of the MESFET is explained together with a method for fabricating the same for convenience.

FIG. 1A to FIG. 1D and FIG. 2A to FIG. 2C are schematic cross-sectional views showing the method for fabricating the MESFET of this embodiment in the order of steps.

In order to fabricate this MESFET, various structures are first formed on a semiconductor substrate.

Figure 1A:
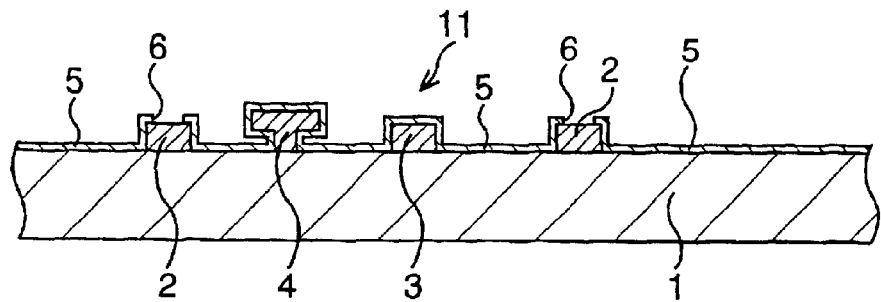
FIG. 1A to FIG. 1D are schematic cross-sectional views showing a method for fabricating an MESFET according to the first embodiment in the order of steps.

Specifically, as shown in FIG. 1A, a source 2, a drain 3, and a gate electrode 4 of the MESFET, a not-shown capacitor, resistor, and the like are patterned on a semiconductor substrate 1 such as a GaAs substrate to form a circuit region 11. Here, the gate electrode 4 is formed in an overhanging shape in order to realize a lower resistance of an electrode because elements are made to be finer.

Next, an insulating material is deposited in a film thickness of approximately 50 nm on the entire surface of the MESFET including the circuit region 11 to form a thin surface protective film 5. The surface protective film 5 ensures minimum moisture-resistance of each of the structures on the semiconductor substrate 1 including the circuit region 11. Then, the surface protective film 5 on a portion connecting later-described air bridge wiring, the source 2 in this case, is removed by photolithography and subsequent dry etching, so as to form an opening hole 6 to expose a part of a surface of the source 2.

Subsequently, a protective pattern to cover a predetermined area of the circuit region 11 is formed.

Figure 1B:
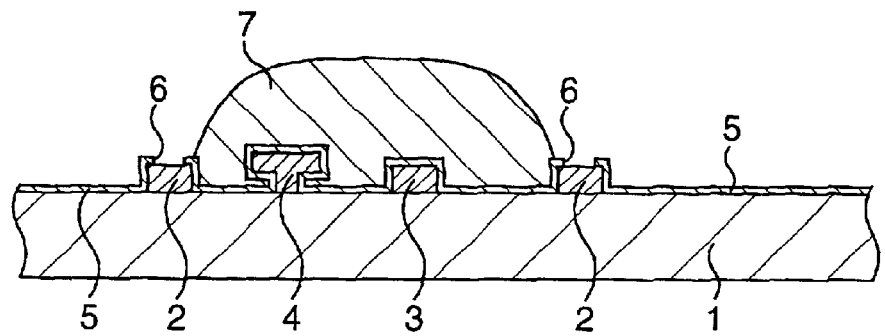

Specifically, as shown in FIG. 1B, a resist is applied onto the semiconductor substrate 1 and patterned to form a protective pattern 7 having a shape covering at least complicatedly-constituted structures among those in the circuit region 11, namely, the overhanging-shaped gate electrode 4 and the drain 3 in this case. Here, the protective pattern 7 needs to be formed to expose the source 2 serving as an air bridge connecting portion at its end.

Then, an air bridge structure is formed.

Figure 1C:
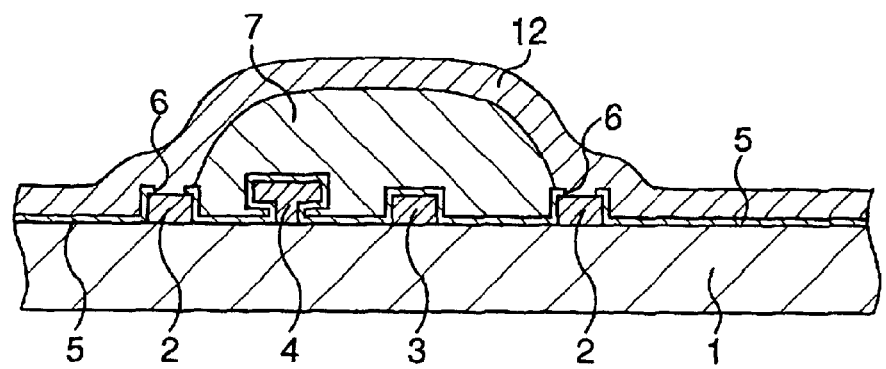

Specifically, a metallic film 12 made of Au is first formed on the semiconductor substrate 1 to cover the protective pattern 7 as shown in FIG. 1C.

Here, the metallic film 12 is formed by a plating method after a metal, which is an object to be plated, is grown by an appropriate method selected from a sputtering method, a vapor deposition method, and the like.

Figure 1D:
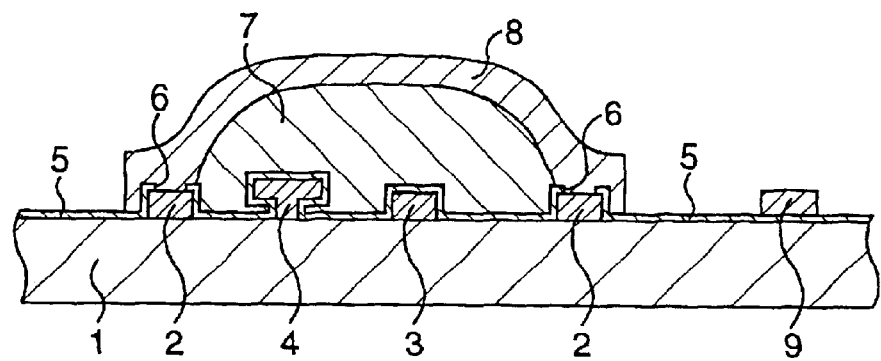

Next, as shown in FIG. 1D, the metallic film 12 is patterned by photolithography and subsequent dry etching to form air bridge wiring 8 electrically connecting a pair of sources 2 via the opening holes 6 as well as to form Au wiring 9 on the semiconductor substrate.

Then, an air bridge protective film covering the air bridge wiring to prevent a poor connection, a break, and the like of the wiring from occurring is formed.

Figure 2A:
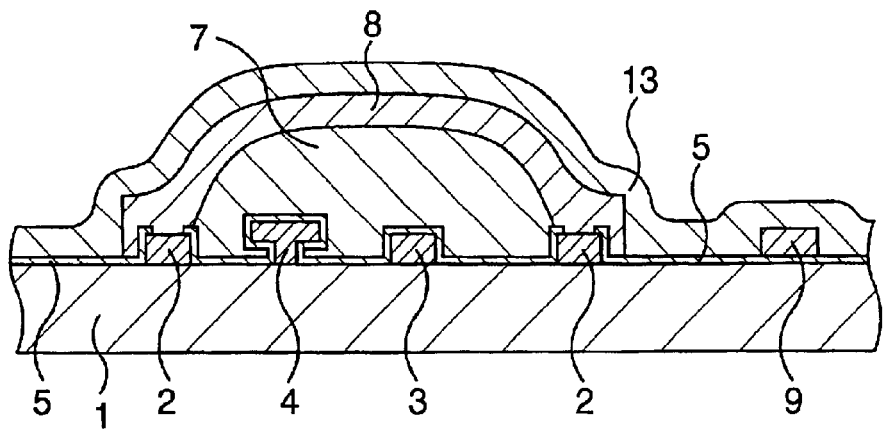
FIG. 2A to FIG. 2C are schematic cross-sectional views showing the method for fabricating the MESFET according to the first embodiment in the order of steps, in succession to FIG. 1D.

Specifically, an insulating film 13 made of SiN or the like is first deposited in a film thickness of 100 nm or larger on the semiconductor substrate 1 by a CVD method to cover the air bridge wiring 8 and the Au wiring 9, as shown in FIG. 2A.

Figure 2B:
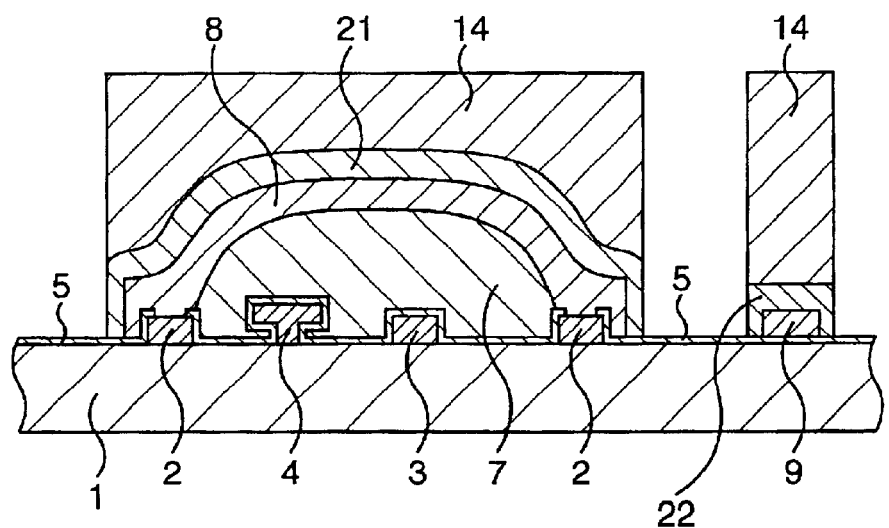

Subsequently, as shown in FIG. 2B, a resist is applied onto the insulating film 13 and the resist is processed by photolithography to be left on a region covering a surface of the air bridge wiring 8 and a region covering a surface of the Au wiring 9 so that a resist pattern 14 is formed.

Then, the insulating film 13 is dry-etched with the resist pattern 14 as a mask so as to form an air bridge protective film 21 covering the surface of the air bridge wiring 8 and a wiring protective film 22 covering the surface of the Au wiring 9.

Figure 2C:
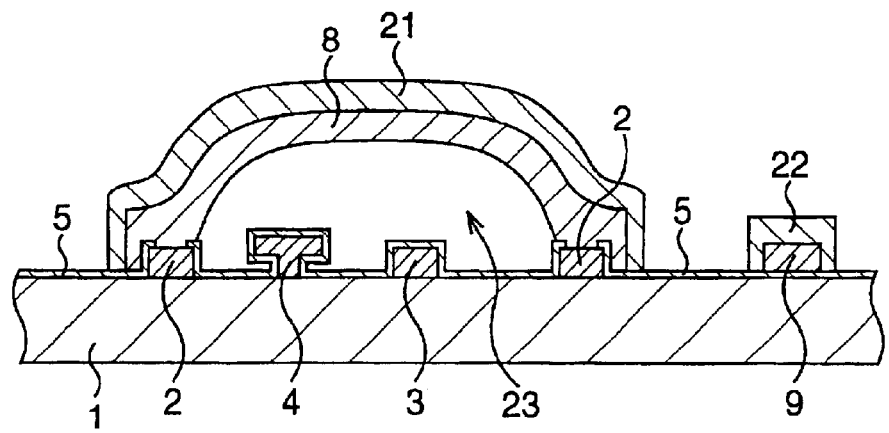

Next, after the resist pattern 14 is removed, as shown in FIG. 2C, ashing treatment using ozone plasma is performed to selectively remove the protective pattern 7 by etching. At this time, a hollow 23 is formed between the air bridge wiring 8 and the circuit region 11 and an area which has been covered by the protective pattern 7 is in a state in which only the surface protective film 5 covering the structures is formed.

The MESFET is completed through the above-described steps.

As explained above, according to this embodiment, the air bridge structure is adopted to reduce parasitic capacitance between wires and to a gate so that the MESFET having a high-frequency characteristic is realized. In addition, since the air bridge wiring 8 is securely covered and protected by the thick air bridge protective film 21, various troubles (such as a short circuit of the wiring) due to adhesion of a foreign substance such as a dust or occurrence of damage due to a flaw can be prevented. Moreover, the air bridge protective film 21 is not formed on at least complicatedly-constituted structures among those in the circuit region 11, namely, the overhanging-shaped gate electrode 4 and the drain 3 in this case, so that a film thickness of the air bridge protective film 21 can be made uniform, which makes it possible to desirably control the film thickness and to ensure extremely high reliability of the MESFET.

Second Embodiment

In this embodiment, an MESFET having an air bridge structure is described as an example, as in the first embodiment, but there is a slight difference in the fabricating steps.

FIG. 3A to FIG. 3C, FIG. 4A, and FIG. 4B are schematic cross-sectional views showing a method for fabricating the MESFET of this embodiment in the order of steps.

In order to fabricate this MESFET, various structures are first formed on a semiconductor substrate.

Figure 3A:
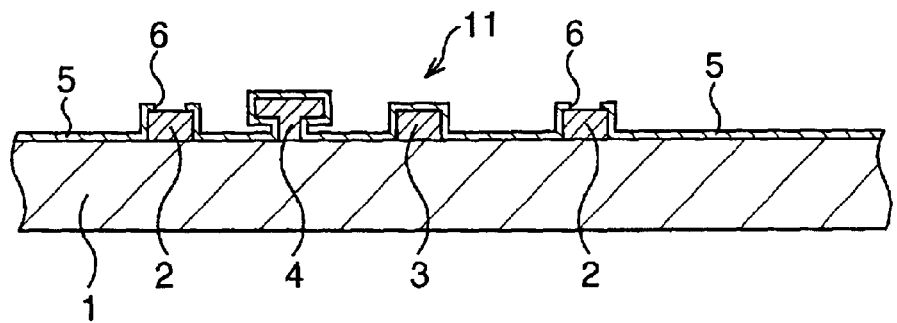
FIG. 3A to FIG. 3C are schematic cross-sectional views showing a method for fabricating an MESFET according to the second embodiment in the order of steps.

Specifically, as shown in FIG. 3A, a source 2, a drain 3, and a gate electrode 4 of the MESFET, and a not-shown capacitor, resistor, and the like are patterned on a semiconductor substrate 1 such as a GaAs substrate to form a circuit region 11. Here, the gate electrode 4 is formed in an overhanging shape in order to realize a lower resistance of an electrode because elements are made to be finer.

Next, an insulating material is deposited in a film thickness of approximately 50 nm on the entire surface of the MESFET including the circuit region 11 to form a thin surface protective film 5. The surface protective firm 5 ensures minimum moisture-resistance of each of the structures on the semiconductor substrate 1 including the circuit region 11. Then, the surface protective film 5 on a portion connecting later-described air bridge wiring, the source 2 in this case, is removed by photolithography and subsequent dry etching, so as to form an opening hole 6 to expose a part of a surface of the source 2.

Subsequently, a protective pattern to cover a predetermined area of the circuit region 11 is formed.

Figure 3B:
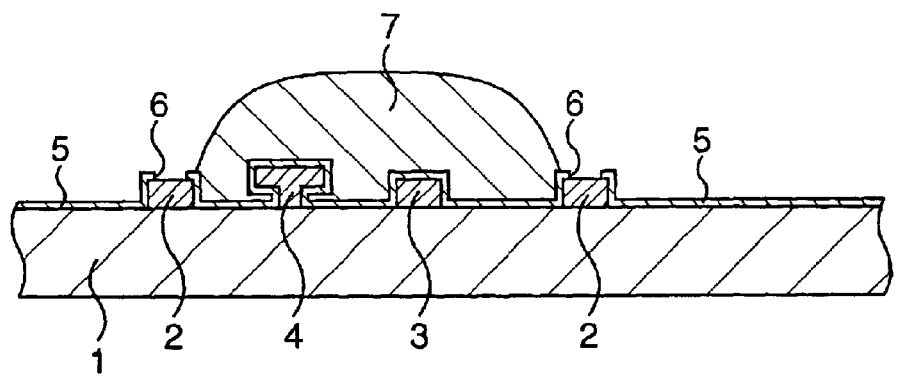

Specifically, as shown in FIG. 3B, a resist is applied onto the semiconductor substrate 1 and patterned to form a protective pattern 7 having a shape covering at least complicatedly-constituted structures among those in the circuit region 11, namely, the overhanging-shaped gate electrode 3 and the drain 2 in this case. Here, the protective pattern 7 needs to be formed to expose the source 2 serving as an air bridge connecting portion at its end.

Then, an air bridge protective film forming an air bridge structure and covering the air bridge wiring to prevent a poor connection, a break, and the like of the wiring from occurring is formed.

Figure 3C:
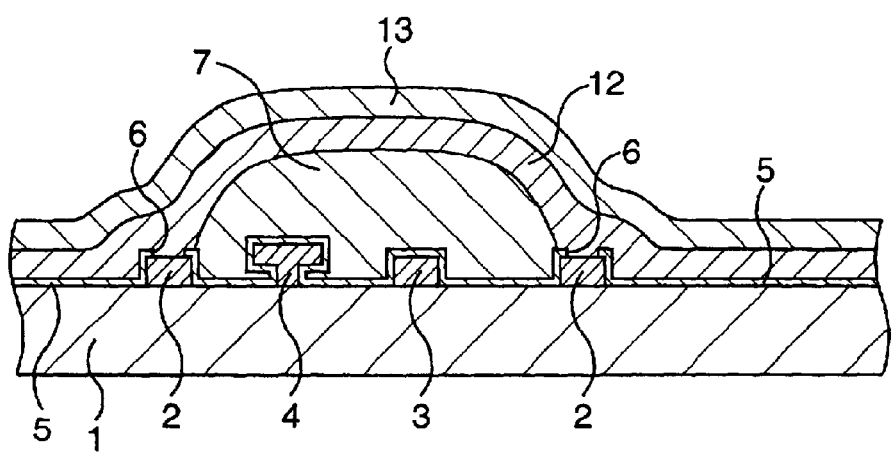

Specifically, as shown in FIG. 3C, a metallic film 12 made of Au is first formed on the semiconductor substrate 1 to cover the protective pattern 7.

Here, the metallic film 12 is formed by a plating method after a metal, which is an object to be plated, is grown by an appropriate method selected from a sputtering method, a vapor deposition method, and the like.

Next, an insulating film 13 made of SiN or the like is deposited in a film thickness of 100 nm or larger to cover the metallic film 12 by a CVD method.

Figure 4A:
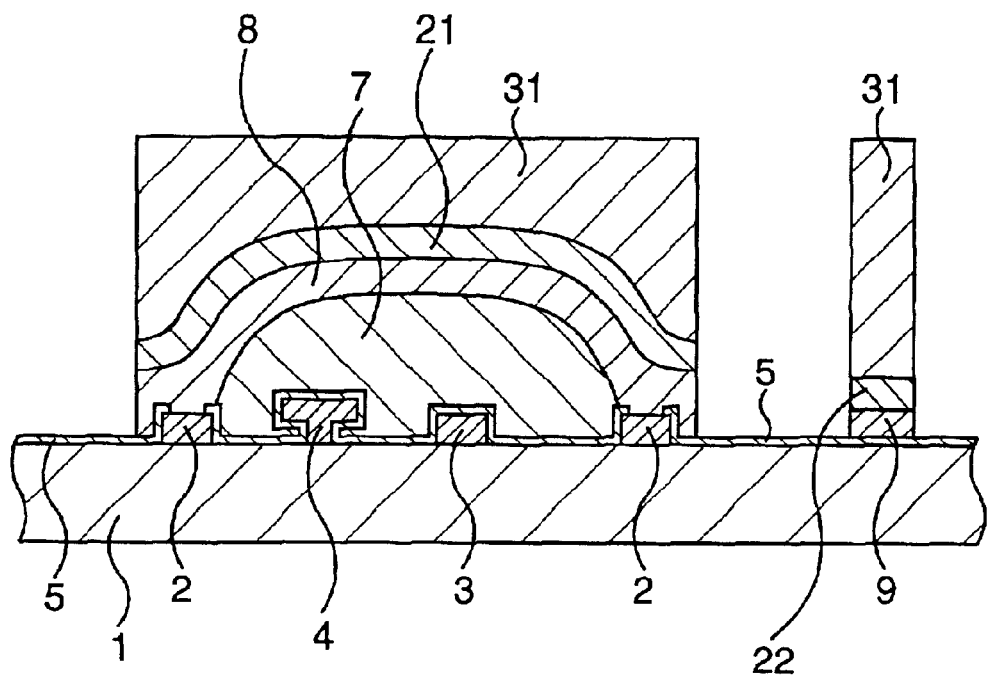
FIG. 4A and FIG. 4B are schematic cross-sectional views showing the method for fabricating the MESFET according to the second embodiment in the order of steps, in succession to FIG. 3C.

Then, as shown in FIG. 4A, a resist is applied onto the insulating film 13, and the resist is processed by photolithography to be left in a shape of the air bridge wiring and a shape of the Au wiring so as to form a resist pattern 31.

Then, the insulating film 13 and the metallic film 12 are dry-etched with the resist pattern 31 as a mask to form air bridge wiring 8 electrically connecting a pair of sources 2 via the opening holes 6 and to form Au wiring 9 on the semiconductor substrate. At this time, by the dry etching, an air bridge protective film 21 covering a surface of the air bridge wiring 8 and a wiring protective film 22 covering a surface of the Au wiring 9 are formed as well as the wiring 8 and 9.

Figure 4B:
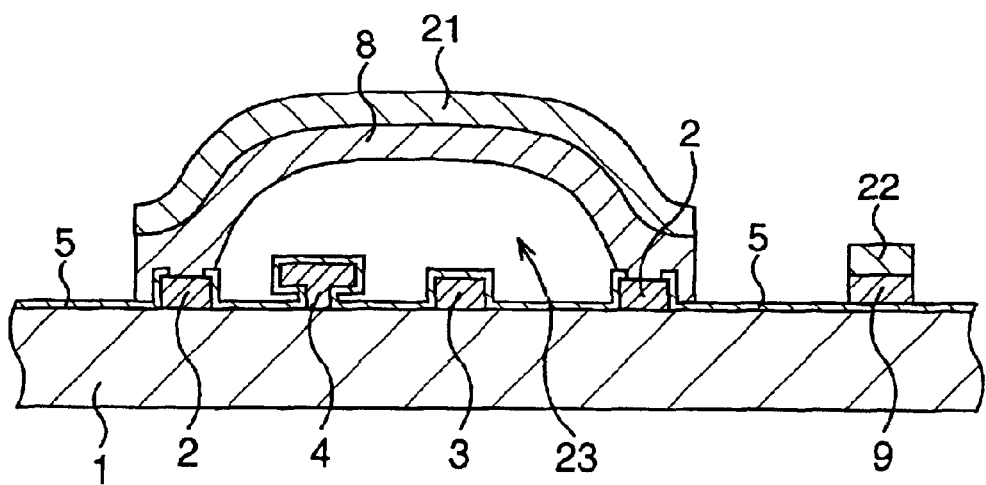
Figure 5:
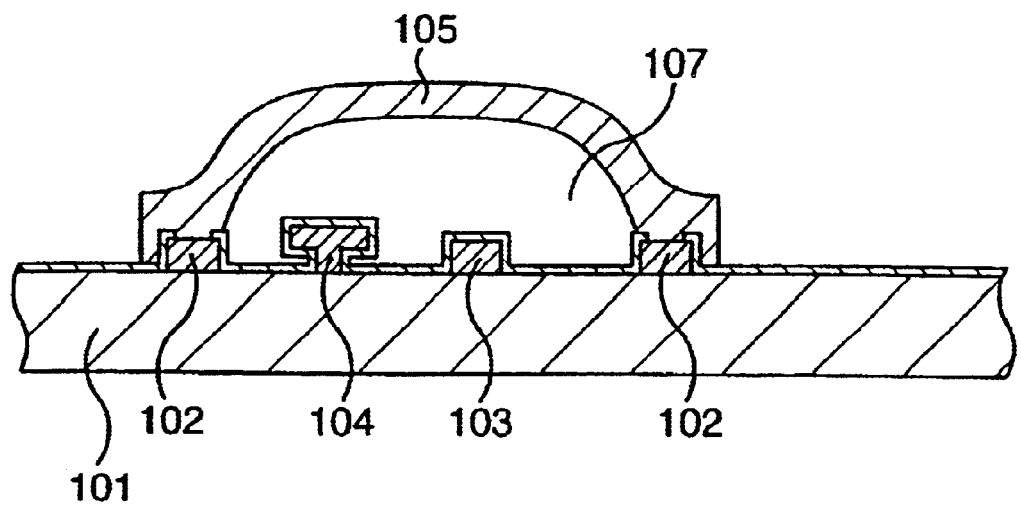
FIG. 5 is a schematic cross-sectional view showing an example of an MESFET having a conventional air bridge structure.
Figure 6:
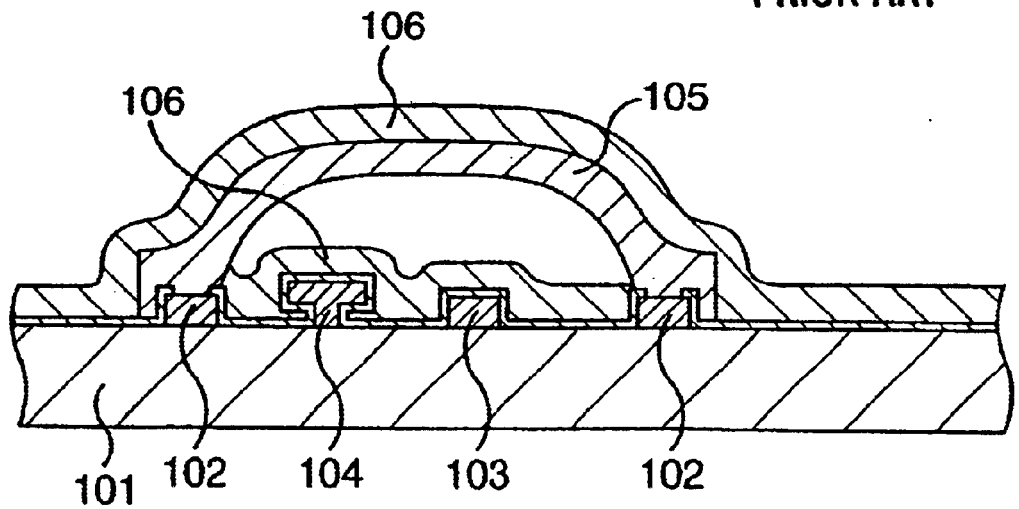
FIG. 6 is a schematic cross-sectional view showing another example of the MESFET having the conventional air bridge structure.

Next, after the resist pattern 31 is removed, as shown in FIG. 4B, ashing treatment using ozone plasma is performed to selectively remove the protective pattern 7 by etching. At this time, a hollow 23 is formed between the air bridge wiring 8 and the circuit region 11 and an area which has been covered by the protective pattern 7 is in a state in which only the surface protective film 5 covering the structures is formed.

The MESFET is completed through the above-described steps.

As explained above, according to this embodiment, the air bridge structure is adopted to reduce parasitic capacitance between wires and to a gate so that an MESFET having a high-frequency characteristic is realized. In addition, since the air bridge wiring 8 is securely covered and protected by the thick air bridge protective film 21, various troubles (such as a short circuit of the wiring) due to adhesion of a foreign substance such as a dust or damage due to a flaw can be prevented from occurring. Moreover, the air bridge protective film 21 is not formed on at least complicatedly-constituted structures among those in the circuit region 11, namely, the overhanging-shaped gate electrode 4 and the drain 3 in this case, so that a film thickness of the air bridge protective film 21 can be made uniform, which makes it possible to desirably control the film thickness and to ensure extremely high reliability of the MESFET.

Further, the air bridge wiring 8 (the Au wiring 9) and the air bridge protective film 21 (the wiring protective film 22) are patterned in one step using the common resist pattern 31, which enables simplification of the steps and reduction in the number of steps.

Incidentally, although the MESFET is explained as an example of a semiconductor device in the first and second embodiments, the present invention is not limited to this and can be applied to various semiconductor devices, for example, an HEMT and the like.

According to the present invention, an air bridge structure is adopted while troubles such as a poor connection, a break, and a short circuit of air bridge wiring can be prevented so as to realize a high-frequency characteristic and to sufficiently ensure high reliability of a device.

What is claimed is:

1. A method of fabricating a semiconductor device, comprising the steps of:

applying resist on a semiconductor substrate;

patterning said resist thereby forming a protective pattern made of said resist in a shape covering a predetermined area on said semiconductor substrate and exposing an air bridge connecting portion at an end thereof;

forming a conductive film covering said protective pattern, said conductive film being directly connected to said air bridge connecting portion;

forming an insulating film covering said conductive film while said protective pattern is covered with said conductive film;

processing said insulating film and said conductive film to form air bridge wiring connected with said air bridge connecting portion following a shape of said protective pattern and to form an air bridge protective film covering said air bridge wiring, said air bridge wiring being made of said conductive film; and removing said protective pattern to form a hollow between said air bridge wiring and said predetermined area.

2. The method for fabricating a semiconductor device according to claim 1, wherein said predetermined area on said semiconductor substrate is a circuit region having a plurality of wires, and said air bridge connecting portion is a pair of wires in said circuit region.

3. The method for fabricating a semiconductor device according to claim 2, wherein said circuit region includes an electrode in an overhanging shape.

4. The method for fabricating a semiconductor device according to claim 1, further comprising the step of, forming a surface protective film thinner than said air bridge protective film covering said predetermined area before forming said protective pattern.

5. The method for fabricating a semiconductor device according to claim 1, wherein said predetermined area and said air bridge connecting portion are formed substantially on the same surface.

6. A method of fabricating a semiconductor device, comprising the steps of:

applying resist on a semiconductor substrate;

patterning said resist thereby forming a protective pattern made of resist in a shape covering a predetermined area on said semiconductor substrate and exposing an air bridge connecting portion at an end thereof;

forming a conductive film covering said protective pattern, said conductive film being directly connected to said air bridge connecting portion;

processing said conductive film to form air bridge wiring connected with said air bridge connecting portion following a shape of said protective pattern, said air bridge wiring being made of said conductive film;

forming an insulating film covering said conductive film while said protective pattern is covered with said conductive film;

processing said insulating film to form an air bridge protective film having a predetermined shape covering said air bridge wiring; and removing said protective pattern to form a hollow between said air bridge wiring and said predetermined area.

7. The method for fabricating a semiconductor device according to claim 6, wherein said predetermined area on said semiconductor substrate is a circuit region having a plurality of wires, and said air bridge connecting portion is a pair of wires in said circuit region.

8. The method for fabricating a semiconductor device according to claim 7, wherein said circuit region includes an electrode in an overhanging shape.

9. The method for fabricating a semiconductor device according to claim 6, further comprising the step of, forming a surface protective film thinner than said air bridge protective film covering said predetermined area before forming said protective pattern.

10. The method of fabricating a semiconductor device according to claim 6, wherein said predetermined area and said air bridge connecting portion are formed substantially on the same surface.

* * * * *